(12) United States Patent
Takata

(10) Patent No.: US 12,512,820 B2
(45) Date of Patent: Dec. 30, 2025

(54) FILTER DEVICE AND MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 236 days.

(21) Appl. No.: 18/234,915

(22) Filed: Aug. 17, 2023

(65) Prior Publication Data

US 2024/0072768 A1   Feb. 29, 2024

(30) Foreign Application Priority Data

Aug. 31, 2022   (JP) .................. 2022-138030

(51) Int. Cl.
*H03H 9/72* (2006.01)
*H03H 9/02* (2006.01)
*H03H 9/64* (2006.01)

(52) U.S. Cl.
CPC .......... *H03H 9/72* (2013.01); *H03H 9/02661* (2013.01); *H03H 9/6483* (2013.01)

(58) Field of Classification Search
CPC ........ H03H 9/6483; H03H 9/725; H03H 9/25; H03H 9/1457; H03H 9/145; H03H 9/205; H03H 9/02574; H03H 9/64; H03H 9/568; H03H 9/72; H03H 9/02992; H03H 9/542; H03H 9/6496; H03H 9/1452; H03H 9/14573; H03H 7/0161; H03H 9/02637; H03H 9/02559; H03H 9/14541; H03H 9/6403

See application file for complete search history.

(56) References Cited

U.S. PATENT DOCUMENTS

| | | | | |
|---|---|---|---|---|
| 2010/0194496 | A1* | 8/2010 | Goto | H03H 9/0071 |
| | | | | 333/195 |
| 2011/0316648 | A1* | 12/2011 | Fujita | H03H 9/725 |
| | | | | 333/195 |
| 2019/0190493 | A1* | 6/2019 | Nosaka | H03H 9/6483 |
| 2021/0099159 | A1* | 4/2021 | Takata | H03H 9/25 |

FOREIGN PATENT DOCUMENTS

JP   11-312951 A   11/1999

* cited by examiner

*Primary Examiner* — Lincoln D Donovan
*Assistant Examiner* — Tyler J Pereny
(74) *Attorney, Agent, or Firm* — Keating & Bennett, LLP

(57) ABSTRACT

A filter device includes a series arm connecting input and output terminals. Parallel arms branch from the series arm to a ground terminal. The parallel arms include first and second parallel arms branching from portions of the series arm. The first and second parallel arm resonators are respectively provided in or on the first and second parallel arms. The parallel arm resonators each include an IDT electrode including electrode fingers. Each IDT electrode includes an overlap region. A number of pairs of electrode fingers of the IDT electrode in the first parallel arm resonator is greater than a number of pairs of electrode fingers of the IDT electrode in the second parallel arm resonator. An overlap width of the IDT electrode in the first parallel arm resonator is narrower than the overlap width of the IDT electrode in the second parallel arm resonator.

16 Claims, 5 Drawing Sheets

FILTER DEVICE AND MULTIPLEXER

CROSS REFERENCE TO RELATED APPLICATIONS

This application claims the benefit of priority to Japanese Patent Application No. 2022-138030 filed on Aug. 31, 2022. The entire contents of this application are hereby incorporated herein by reference.

BACKGROUND OF THE INVENTION

1. Field of the Invention

The present invention relates to a filter device and a multiplexer.

2. Description of the Related Art

Conventionally, filter devices each including a plurality of acoustic wave resonators have been widely used as filters for cellular phones and the like. Japanese Unexamined Patent Application Publication No. 11-312951 discloses an example of a surface acoustic wave (SAW) filter. The SAW filter in Japanese Unexamined Patent Application Publication No. 11-312951 has a ladder circuit. The ladder circuit is provided with a group of parallel resonators. In the group of parallel resonators, two parallel resonators are connected in parallel with each other. The two parallel resonators in the group of parallel resonators have different resonant frequencies. In contrast, the two parallel resonators have the same number of pairs of electrode fingers and the same overlap width of an interdigital transducer (IDT) electrode.

In the SAW filter described in Japanese Unexamined Patent Application Publication No. 11-312951, it is difficult to sufficiently increase the maximum value of a combined Q value as a Q value combining the Q values of the two parallel resonators in the group of parallel resonators. Therefore, the insertion loss on the low-frequency side within the passband increases.

SUMMARY OF THE INVENTION

Preferred embodiments of the present invention provide filter devices and multiplexers that are each able to reduce insertion loss on a low-frequency side within a passband.

A filter device according to a preferred embodiment of the present invention is a band-pass filter device having a passband, including an input terminal and an output terminal, at least one ground terminal, and a plurality of parallel arm resonators including a first parallel arm resonator and a second parallel arm resonator. In a circuit configuration, a path connecting the input terminal and the output terminal is a series arm, and a plurality of paths branching from the series arm to the ground terminal are a plurality of parallel arms. The plurality of parallel arms include a first parallel arm and a second parallel arm branching to the ground terminal from portions of the series arm that are at a same potential or substantially the same potential. The first parallel arm resonator is provided in or on the first parallel arm, and the second parallel arm resonator is provided in or on the second parallel arm. The plurality of parallel arm resonators each include an IDT electrode including a plurality of electrode fingers. In each IDT electrode, when a direction in which the plurality of electrode fingers extend is an electrode finger extending direction, each IDT electrode includes an overlap region where adjacent electrode fingers overlap each other in a direction perpendicular or substantially perpendicular to the electrode finger extending direction. Anti-resonant frequencies of the first parallel arm resonator and the second parallel arm resonator are both positioned within the passband. A resonant frequency of the first parallel arm resonator is higher than a resonant frequency of the second parallel arm resonator. A number of pairs of the electrode fingers of the IDT electrode in the first parallel arm resonator is greater than a number of pairs of the electrode fingers of the IDT electrode in the second parallel arm resonator. When a dimension of the overlap region along the electrode finger extending direction is an overlap width, the overlap width of the IDT electrode in the first parallel arm resonator is narrower than the overlap width of the IDT electrode in the second parallel arm resonator.

A multiplexer according to a preferred embodiment of the present invention includes a common connection terminal and a plurality of filters commonly connected to the common connection terminal, and at least one of the plurality of filters is a filter device according to a preferred embodiment of the present invention.

According to the filter devices and the multiplexers according to preferred embodiments of the present invention, the insertion loss on the low-frequency side within the passband is able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by describing preferred embodiments of the present invention with reference to the drawings.

Each preferred embodiment described in the present specification is exemplary and partial substitutions or combinations of configurations are possible between different preferred embodiments.

Figure 1:
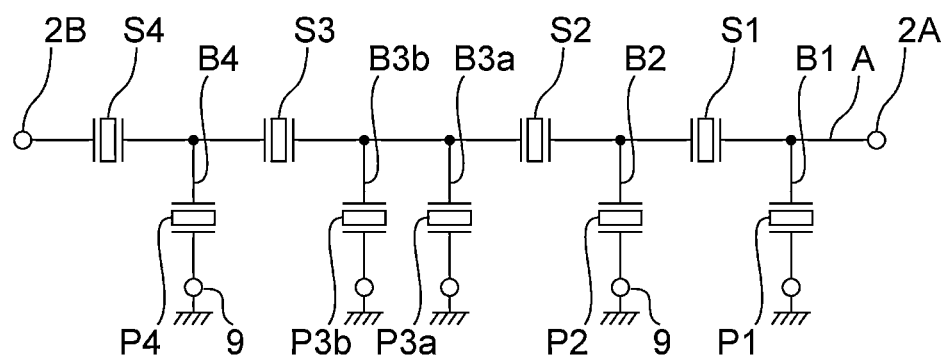
FIG. 1 is a circuit diagram of a filter device according to a first preferred embodiment of the present invention.

FIG. 1 is a circuit diagram of a filter device according to a first preferred embodiment of the present invention.

A filter device 1 is a ladder filter. In the present preferred embodiment, the filter device 1 is, for example, a transmission filter. The passband of the filter device 1 is the transmission band of Bands 13 and 14, and is, for example, about 777 MHz to about 798 MHz. The passband of the filter device 1 is not limited to the above. Furthermore, it is only necessary that the filter device of the present preferred embodiment is a band-pass filter device having a passband. For example, the filter device 1 may be a reception filter. In the present specification, the passband of a filter device refers to a band in which, when the peak value of the insertion loss of the filter device is a reference, the value of the insertion loss is within about 3 dB of the peak value. The peak value of the insertion loss is the minimum value of the insertion loss of the filter device.

The filter device 1 includes an input terminal 2A, an output terminal 2B, a plurality of ground terminals 9, a plurality of series arm resonators, and a plurality of parallel arm resonators. In the present preferred embodiment, the input terminal 2A, the output terminal 2B, and the ground terminals 9 are configured as, for example, electrode pads. The input terminal 2A, the output terminal 2B, and the ground terminals 9 may be configured as wiring, for example.

The circuit configuration of the filter device 1 includes a series arm A and a plurality of parallel arms. The series arm A is a path connecting the input terminal 2A and the output terminal 2B. The series arm A is provided with each series arm resonator. In contrast, each parallel arm is a path branching from the series arm A to a corresponding one of the ground terminals 9. Each parallel arm is provided with a corresponding one of the parallel arm resonators. The ground terminals 9 are terminals connected to a reference potential.

The plurality of series arm resonators in the present preferred embodiment are, specifically, a series arm resonator S1, a series arm resonator S2, a series arm resonator S3, and a series arm resonator S4. The series arm resonator S1, the series arm resonator S2, the series arm resonator S3, and the series arm resonator S4 are connected in this order from the input terminal 2A side.

The plurality of parallel arm resonators in the present preferred embodiment are, specifically, a parallel arm resonator P1, a parallel arm resonator P2, a parallel arm resonator P3a, a parallel arm resonator P3b, and a parallel arm resonator P4. Here, the plurality of parallel arms include a parallel arm B1, a parallel arm B2, a parallel arm B3a, a parallel arm B3b, and a parallel arm B4. The parallel arm B1 branches from a portion of the series arm A between the input terminal 2A and the series arm resonator S1. The parallel arm B1 is provided with the parallel arm resonator P1. The parallel arm B2 branches from a portion of the series arm A between the series arm resonator S1 and the series arm resonator S2. The parallel arm B2 is provided with the parallel arm resonator P2.

The parallel arm B3a and the parallel arm B3b branch from portions of the series arm A between the series arm resonator S2 and the series arm resonator S3. That is, the parallel arm B3a and the parallel arm B3b branch from portions of the series arm A that are at the same potential or substantially the same potential to the ground terminals 9. The parallel arm B3a is provided with the parallel arm resonator P3a. The parallel arm B3b is provided with the parallel arm resonator P3b. The parallel arm B3a is a first parallel arm. The parallel arm resonator P3a is a first parallel arm resonator. In contrast, the parallel arm B3b is a second parallel arm. The parallel arm resonator P3b is a second parallel arm resonator.

The parallel arm B4 branches from a portion of the series arm A between the series arm resonator S3 and the series arm resonator S4. The parallel arm B4 is provided with the parallel arm resonator P4. The circuit configuration of the filter device 1 is not limited to the above. It is only necessary that the filter device 1 includes a first parallel arm and a second parallel arm, and includes a first parallel arm resonator and a second parallel arm resonator. As illustrated in FIG. 1, all of the parallel arms are individually connected to the ground terminals 9 in the present preferred embodiment. However, two or more parallel arms may be commonly connected to one ground terminal 9. It is only necessary that at least one ground terminal 9 is provided.

All of the series arm resonators and all of the parallel arm resonators of the filter device 1 are acoustic wave elements. More specifically, all of the series arm resonators and all of the parallel arm resonators of the filter device 1 are surface acoustic wave (SAW) resonators. The specific configuration of each resonator will be described below.

Figure 2:
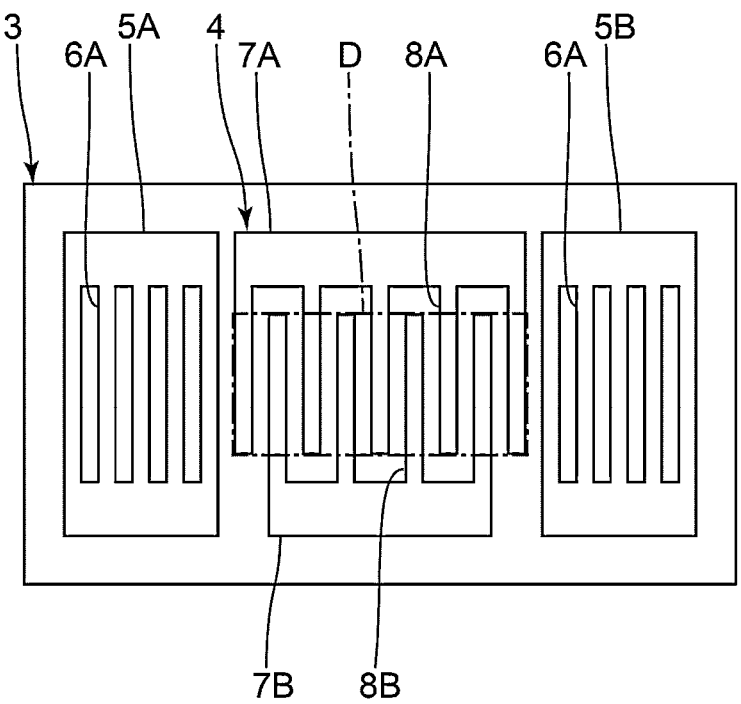
FIG. 2 is a plan view illustrating the schematic electrode configuration of a first parallel arm resonator in the first preferred embodiment of the present invention.

FIG. 2 is a plan view illustrating the schematic electrode configuration of the first parallel arm resonator in the first preferred embodiment. The wiring and the like connected to the parallel arm resonator P3a as the first parallel arm resonator are omitted in FIG. 2.

The parallel arm resonator P3a shares a piezoelectric substrate 3 with each of the other parallel arm resonators and each series arm resonator. In the present preferred embodiment, the piezoelectric substrate 3 is a substrate including only a piezoelectric material. As the piezoelectric material, for example, lithium tantalate, lithium niobate, zinc oxide, aluminum nitride, crystal, or lead zirconate titanate (PZT) may be used.

The piezoelectric substrate 3 may be a laminated substrate including a piezoelectric layer. The piezoelectric material as described above can be used for a piezoelectric layer. In the case where the piezoelectric substrate 3 is a laminated substrate, for example, a piezoelectric layer may be laminated on a support substrate. Alternatively, for example, at least one dielectric layer may be laminated between a support substrate and a piezoelectric layer.

As illustrated in FIG. 2, the parallel arm resonator P3a includes an interdigital transducer (IDT) electrode 4, and a pair of reflectors 5A and 5B. The IDT electrode 4 and the pair of reflectors 5a and 5b are provided on the piezoelectric substrate 3. By applying an alternating current (AC) voltage to the IDT electrode 4, an acoustic wave is excited.

The IDT electrode 4 includes a first busbar 7A, a second busbar 7B, a plurality of first electrode fingers 8A, and a plurality of second electrode fingers 8B. The first busbar 7A and the second busbar 7B face each other. Of two ends of the first electrode fingers 8A, first ends are each connected to the first busbar 7A. Of two ends of the second electrode fingers 8B, first ends are each connected to the second busbar 7B. The first electrode fingers 8A and the second electrode fingers 8B are connected to different potentials. The first electrode fingers 8A and the second electrode fingers 8B are interdigitated with each other.

Hereinafter, the first electrode fingers 8A and the second electrode fingers 8B may be collectively referred to simply as electrode fingers. When a direction in which the electrode fingers extend is an electrode finger extending direction, and when viewed from a direction perpendicular or substantially perpendicular to the electrode finger extending direction, a region where adjacent electrode fingers overlap each other, which are connected to different potentials, is an overlap region D of the IDT electrode 4. An acoustic wave is excited in the overlap region D. It is assumed hereinafter that a dimension of the overlap region D that is along the electrode finger extending direction is an overlap width. It is assumed that each pair of adjacent electrode fingers, which are connected to different potentials, is a pair of electrode fingers. When the total number of electrode fingers of the overlap region D is N, then the number of pairs of electrode fingers can be derived as (N−1)/2 [pairs].

The reflector 5A and the reflector 5B face each other across the IDT electrode 4 in a direction perpendicular or substantially perpendicular to the electrode finger extending direction. Each reflector includes a plurality of reflector electrode fingers 6A. The IDT electrode 4, the reflector 5A, and the reflector 5B may include a single layer of a metal film, or may include a laminated metal film.

As illustrated in FIG. 1, similar to the parallel arm resonator P3a, each parallel arm resonator and each series arm resonator other than the parallel arm resonator P3a also include an IDT electrode and a pair of reflectors, and include an overlap region. As described above, all of the parallel arm resonators and all of the series arm resonators in the filter device 1 share the piezoelectric substrate 3. Each series arm resonator and each parallel arm resonator may individually include the piezoelectric substrate 3.

Features of the present preferred embodiment reside in having the following configurations. 1) The anti-resonant frequencies of the first parallel arm resonator and the second parallel arm resonator are both positioned within the passband. 2) The resonant frequency of the first parallel arm resonator is higher than the resonant frequency of the second parallel arm resonator. 3) The number of pairs of electrode fingers of the IDT electrode in the first parallel arm resonator is greater than the number of pairs of electrode fingers of the IDT electrode in the second parallel arm resonator. 4) The overlap width of the IDT electrode in the first parallel arm resonator is narrower than the overlap width of the IDT electrode in the second parallel arm resonator. Accordingly, the insertion loss on the low-frequency side within the passband of the filter device 1 can be reduced. This will be described in detail below by comparing the present preferred embodiment with a first reference example.

The first reference example has a circuit configuration that is the same as or similar to that of the first preferred embodiment. The first reference example differs from the first preferred embodiment only in the number of pairs of electrode fingers and the overlap width of the IDT electrode in the first parallel arm resonator and the second parallel arm resonator. Specifically, the first reference example does not have the configurations of 3) and 4) described above in the first preferred embodiment. More specifically, the design parameters of the first parallel arm resonator and the second parallel arm resonator in the first preferred embodiment and the first reference example are as indicated in Table 1. Since the circuit configuration of the first reference example is the same or substantially the same as the circuit configuration of the first preferred embodiment, reference symbols indicated in FIG. 1 may be incorporated into the description of the first reference example.

TABLE 1

| | | Resonant frequency | Number of pairs of electrode fingers of IDT electrode | Overlap width | Electrostatic capacitance of IDT electrode | Number of reflector electrode fingers |
| --- | --- | --- | --- | --- | --- | --- |
| First preferred embodiment | Parallel arm resonator P3a (first parallel arm resonator) | 775 MHz | 70 pairs | 34.3 μm | 1.26 pF | 17 |
| | Parallel arm resonator P3b (second parallel arm resonator) | 769 MHz | 40 pairs | 90 μm | 1.9 pF | 25 |
| First reference example | Parallel arm resonator P3a (first parallel arm resonator) | 775 MHz | 35 pairs | 68.6 μm | 1.26 pF | 17 |
| | Parallel arm resonator P3b (second parallel arm resonator) | 769 MHz | 70 pairs | 51.4 μm | 1.9 pF | 25 |

The design parameters of the parallel arm resonators other than the first parallel arm resonator and the second parallel arm resonator in the first preferred embodiment and the first reference example are as indicated in Table 2. The design parameters indicated in Tables 1 and 2 are an example, and the design parameters of each parallel arm resonator in the first preferred embodiment are not limited to the design parameters in Tables 1 and 2.

TABLE 2

|  | Resonant frequency | Number of pairs of electrode fingers of IDT electrode | Overlap width | Electrostatic capacitance of IDT electrode |
|---|---|---|---|---|
| Parallel arm resonator P1 | 766 MHz | 80 pairs | 92.8 μm | 3.9 pF |
| Parallel arm resonator P2 | 774 MHz | 57 pairs | 112.7 μm | 3.37 pF |
| Parallel arm resonator P4 | 772 MHz | 97 pairs | 55.8 μm | 2.84 pF |

The attenuation amount frequency characteristics of the first preferred embodiment and the first reference example are compared.

Figure 3:
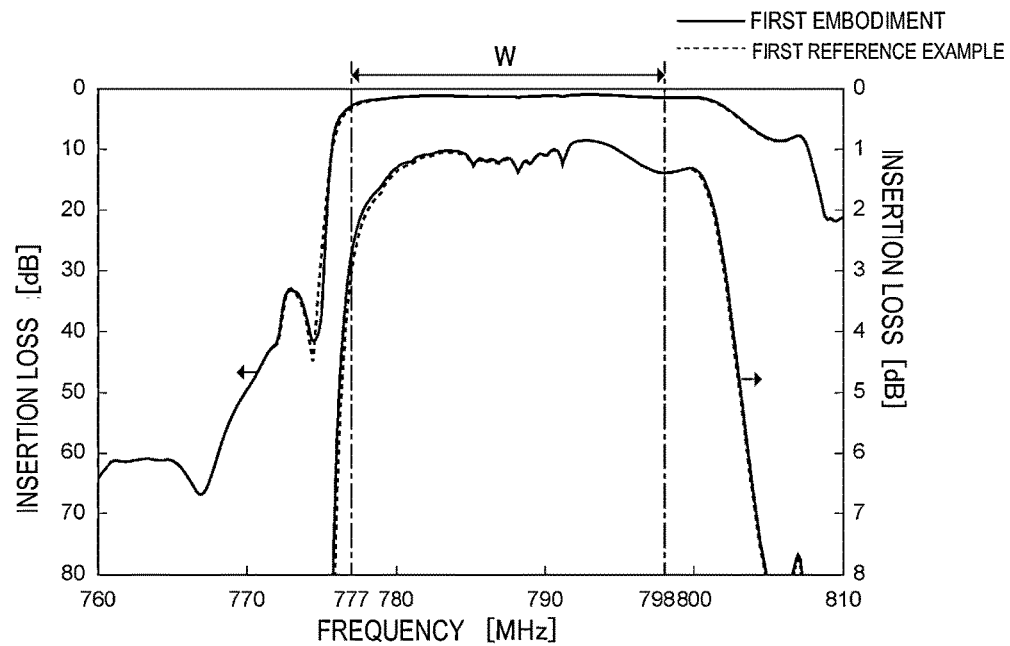
FIG. 3 is a diagram illustrating the attenuation amount frequency characteristics in the first preferred embodiment of the present invention and a first reference example.

FIG. 3 is a diagram illustrating the attenuation amount frequency characteristics in the first preferred embodiment and the first reference example. A double arrow W in FIG. 3 indicates the passband of the filter device in the first preferred embodiment and the first reference example. The same is true in other diagrams.

As illustrated in FIG. 3, it is clear that the insertion loss on the low-frequency side within the passband is smaller in the first preferred embodiment than that in the first reference example. This is due to the first preferred embodiment having the configurations of 1) to 4) described above. That is, in the first preferred embodiment, the anti-resonant frequencies of the first parallel arm resonator and the second parallel arm resonator are both positioned within the passband. Therefore, the first parallel arm resonator and the second parallel arm resonator define the passband of the filter device 1. Then, due to the configurations of 2) to 4) described above, the combined Q value of the first parallel arm resonator and the second parallel arm resonator can be increased on the low-frequency side within the passband. This makes it possible to reduce the insertion loss on the low-frequency side within the passband. The combined Q value being increased will be described below.

Figure 4:
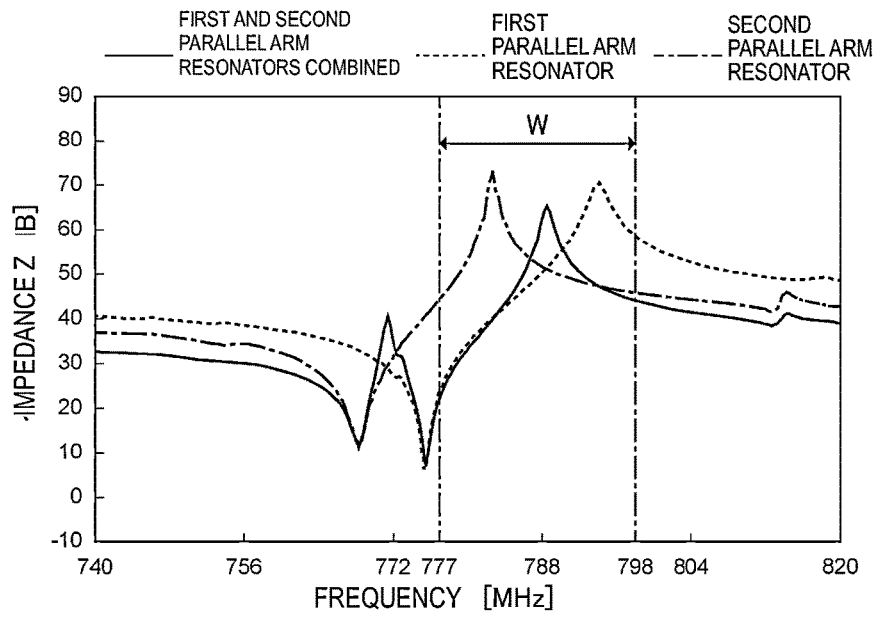
FIG. 4 is a diagram illustrating the impedance frequency characteristics of each of the first parallel arm resonator and a second parallel arm resonator, and the combined impedance frequency characteristics of the first parallel arm resonator and the second parallel arm resonator in the first preferred embodiment of the present invention.
Figure 5:
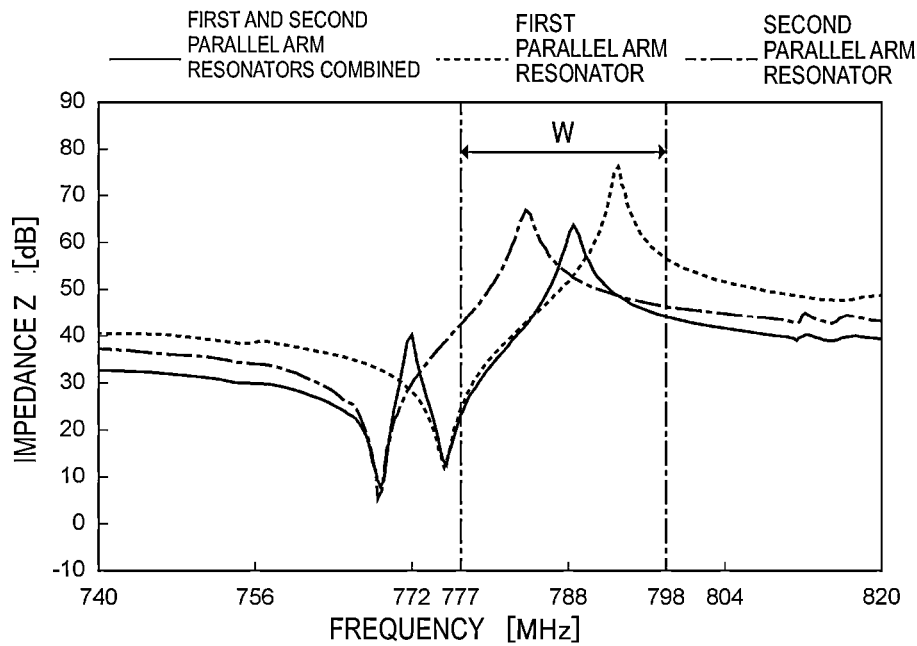
FIG. 5 is a diagram illustrating the impedance frequency characteristics of each of a first parallel arm resonator and a second parallel arm resonator, and the combined impedance frequency characteristics of the first parallel arm resonator and the second parallel arm resonator in the first reference example.

The electrical characteristics of each resonator in the filter device 1 define the filter characteristics and the like of the filter device 1. For example, elements with which the parallel arm resonator P1 and the parallel arm resonator P2 illustrated in FIG. 1 define the above-described filter characteristics and the like are the individual electrical characteristics of the parallel arm resonators. In contrast, the parallel arm resonator P3a as the first parallel arm resonator and the parallel arm resonator P3b as the second parallel arm resonator are provided in or on the parallel arms branching from the portions of the series arm A that are at the same potential. Therefore, elements with which the first parallel arm resonator and the second parallel arm resonator define the above-described filter characteristics and the like are the combined electrical characteristics of the first parallel arm resonator and the second parallel arm resonator. FIGS. 4 and 5 illustrate the combined impedance frequency characteristics of the first parallel arm resonator and the second parallel arm resonator in the first preferred embodiment and the first reference example.

FIG. 4 is a diagram illustrating the impedance frequency characteristics of each of the first parallel arm resonator and the second parallel arm resonator, and the combined impedance frequency characteristics of the first parallel arm resonator and the second parallel arm resonator in the first preferred embodiment. FIG. 5 is a diagram illustrating the impedance frequency characteristics of each of the first parallel arm resonator and the second parallel arm resonator, and the combined impedance frequency characteristics of the first parallel arm resonator and the second parallel arm resonator in the first reference example.

As illustrated in FIG. 4, two resonant points and one anti-resonant point appear in the combined impedance frequency characteristics. The frequency of one of the two resonant points in the combined impedance frequency characteristics is the same or substantially the same as the resonant frequency of the first parallel arm resonator. The frequency of the other one of the two resonant points is the same or substantially the same as the resonant frequency of the second parallel arm resonator. The anti-resonant point in the combined impedance frequency characteristics is positioned between the anti-resonant frequency of the first parallel arm resonator and the anti-resonant frequency of the second parallel arm resonator.

As illustrated in FIGS. 4 and 5, the frequencies of the two resonant points and one anti-resonant point in the combined impedance frequency characteristics are unchanged or substantially unchanged between the first preferred embodiment and the first reference example. As described above, it is clear that the number of pairs of electrode fingers and the overlap width of the IDT electrode in the first parallel arm resonator and the second parallel arm resonator have almost no effect on the frequencies of the above-described two resonant points and one anti-resonant point. In contrast, the number of pairs of electrode fingers and the overlap width of the IDT electrode in the first parallel arm resonator and the second parallel arm resonator affect the Q characteristics. This will be described using FIGS. 6 and 7.

Figure 6:
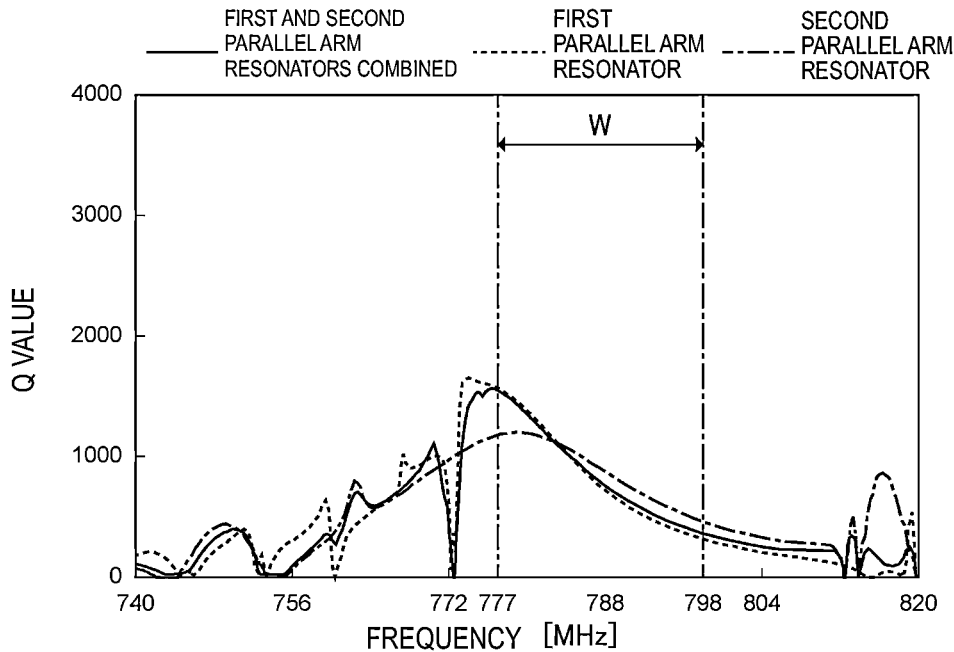
FIG. 6 is a diagram illustrating the Q characteristics of each of the first parallel arm resonator and the second parallel arm resonator, and the combined Q characteristics of the first parallel arm resonator and the second parallel arm resonator in the first preferred embodiment of the present invention.
Figure 7:
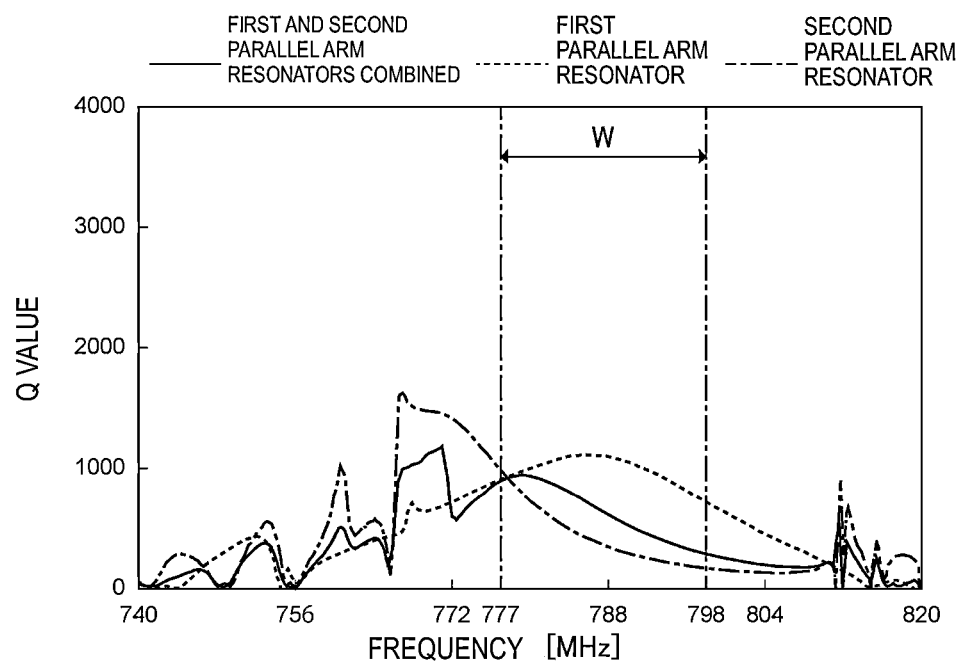
FIG. 7 is a diagram illustrating the Q characteristics of each of the first parallel arm resonator and the second parallel arm resonator, and the combined Q characteristics of the first parallel arm resonator and the second parallel arm resonator in the first reference example.

FIG. 6 is a diagram illustrating the Q characteristics of each of the first parallel arm resonator and the second parallel arm resonator, and the combined Q characteristics of the first parallel arm resonator and the second parallel arm resonator in the first preferred embodiment. FIG. 7 is a diagram illustrating the Q characteristics of each of the first parallel arm resonator and the second parallel arm resonator, and the combined Q characteristics of the first parallel arm resonator and the second parallel arm resonator in the first reference example.

As illustrated in FIG. 6, the Q value of both the first parallel arm resonator and the second parallel arm resonator is higher on the low-frequency side within the passband in the first preferred embodiment. Accordingly, the combined Q value of the first parallel arm resonator and the second parallel arm resonator can be increased on the low-frequency side within the passband. This is due to the following reasons. It is assumed hereinafter that the frequency with the highest Q value is a Qmax frequency.

In the first preferred embodiment, the resonant frequency of the first parallel arm resonator is higher than the resonant frequency of the second parallel arm resonator. Therefore, the resonant frequency of the first parallel arm resonator is close to the frequency of the end portion on the low-frequency side of the passband of the filter device 1. In this case, the greater the number of pairs of electrode fingers of the IDT electrode and the narrower the overlap width, the closer the Qmax frequency is to the frequency of the above-mentioned end portion. In contrast, the resonant frequency of the second parallel arm resonator is low, and the anti-resonant frequency is also low. Therefore, the anti-resonant frequency of the second parallel arm resonator is close to the frequency of the end portion on the low-frequency side of the passband of the filter device 1. In this case, the fewer the number of pairs of electrode fingers of the IDT electrode and the wider the overlap width, the closer the Qmax frequency is to the frequency of the above-described end portion.

Then, in the first preferred embodiment, the number of pairs of electrode fingers of the IDT electrode in the first parallel arm resonator is greater than the number of pairs of electrode fingers of the IDT electrode in the second parallel arm resonator. Furthermore, the overlap width of the IDT electrode in the first parallel arm resonator is narrower than the overlap width of the IDT electrode in the second parallel arm resonator. These make it possible to allow the Q value of both the first parallel arm resonator and the second parallel arm resonator to be highest near the frequency of the end portion on the low-frequency side of the passband of the filter device 1. Accordingly, the combined Q value of the first parallel arm resonator and the second parallel arm resonator can be increased on the low-frequency side within the passband. Thus, the insertion loss can be reduced on the low-frequency side within the passband.

In addition, the resonant frequencies of the first parallel arm resonator and the second parallel arm resonator are different from each other, which can cause ripples to occur in a frequency band that is lower than the passband and close to the passband. Specifically, as illustrated in FIG. 3, ripples occur in the vicinity of about 768 MHz to about 775 MHz. This makes it possible to increase the out-of-band attenuation amount in the vicinity of the passband on the low-frequency side. This can also increase the steepness on the low-frequency side of the passband. In the present specification, high steepness means that the amount of change in frequency is small for a certain amount of change in attenuation amount in the vicinity of the end portion of the passband.

In contrast, in the first reference example, the number of pairs of electrode fingers of the IDT electrode in the first parallel arm resonator with a high resonant frequency is small, and the overlap width is wide. The number of pairs of electrode fingers of the IDT electrode in the second parallel arm resonator with a low resonant frequency is large, and the overlap width is narrow. Therefore, as illustrated in FIG. 7, in each of the first parallel arm resonator and the second parallel arm resonator, the Qmax frequency is away from the frequency of the end portion on the low-frequency side of the passband. Accordingly, in the first reference example, the combined Q value of the first parallel arm resonator and the second parallel arm resonator is low on the low-frequency side within the passband, which makes it difficult to reduce the insertion loss.

Unlike the first reference example, in the case where the number of pairs of electrode fingers and the overlap width of the IDT electrode are the same or substantially the same between the first parallel arm resonator and the second parallel arm resonator, the same or substantially the same advantageous effect as that in the first preferred embodiment cannot be achieved. This will be described below. Here, it is assumed that an example that is different from the first preferred embodiment in the point that the number of pairs of electrode fingers and the overlap width of the IDT electrode are the same or substantially the same between the first parallel arm resonator and the second parallel arm resonator is a second reference example. Since the circuit configuration of the second reference example is the same or substantially the same as the circuit configuration of the first preferred embodiment, reference symbols indicated in FIG. 1 may be incorporated into the description of the second reference example.

Table 3 indicates the design parameters of the first parallel arm resonator and the second parallel arm resonator in the first preferred embodiment, the first reference example, and the second reference example. Table 4 indicates the Qmax frequency of the first parallel arm resonator and the second parallel arm resonator, and the combined Qmax frequency of the first parallel arm resonator and the second parallel arm resonator in the first preferred embodiment, the first reference example, and the second reference example.

TABLE 3

| | | Resonant frequency | Number of pairs of electrode fingers of IDT electrode | Overlap width | Electrostatic capacitance of IDT electrode | Number of reflector electrode fingers |
|---|---|---|---|---|---|---|
| First preferred embodiment | Parallel arm resonator P3a (first parallel arm resonator) | 775 MHz | 70 pairs | 34.3 μm | 1.26 pF | 17 |
| | Parallel arm resonator P3b (second parallel arm resonator) | 769 MHz | 40 pairs | 90 μm | 1.9 pF | 25 |
| First reference example | Parallel arm resonator P3a (first parallel arm resonator) | 775 MHz | 35 pairs | 68.6 μm | 1.26 pF | 17 |
| | Parallel arm resonator P3b (second parallel arm resonator) | 769 MHz | 70 pairs | 51.4 μm | 1.9 pF | 25 |

TABLE 3-continued

|  |  | Resonant frequency | Number of pairs of electrode fingers of IDT electrode | Overlap width | Electrostatic capacitance of IDT electrode | Number of reflector electrode fingers |
|---|---|---|---|---|---|---|
| Second reference example | Parallel arm resonator P3a (first parallel arm resonator) | 775 MHz | 60 pairs | 50 μm | 1.58 pF | 17 |
|  | Parallel arm resonator P3b (second parallel arm resonator) | 769 MHz | 60 pairs | 50 μm | 1.58 pF | 25 |

TABLE 4

| | Qmax frequency | | |
|---|---|---|---|
| | Parallel arm resonator P3a (first parallel arm resonator) | Parallel arm resonator P3b (second parallel arm resonator) | First parallel arm resonator and second parallel arm resonator combined |
| First preferred embodiment | 774 MHz | 778 MHz | 776 MHz |
| First reference example | 786 MHz | 766 MHz | 770 MHz |
| Second reference example | 773 MHz | 767 MHz | 770 MHz |

As indicated in Table 3, in the second reference example, the number of pairs of electrode fingers and the overlap width of the IDT electrode are the same or substantially the same, and the resonant frequencies are different between the first parallel arm resonator and the second parallel arm resonator. In this case, due to the difference in resonant frequency between the first parallel arm resonator and the second parallel arm resonator, a difference also occurs in the Qmax frequency. As indicated in Table 4, it is clear that the difference in Qmax frequency is large between the first parallel arm resonator and the second parallel arm resonator in the second reference example. Therefore, the combined Q value of the first parallel arm resonator and the second parallel arm resonator is low. Accordingly, in the second reference example, the combined Q value of the first parallel arm resonator and the second parallel arm resonator is low on the low-frequency side within the passband, which makes it difficult to reduce the insertion loss.

A preferred configuration of the first preferred embodiment of the present invention will be described below.

As indicated in Table 3, the reflectors of the first parallel arm resonator in the first preferred embodiment include seventeen reflector electrode fingers. The reflectors of the second parallel arm resonator include twenty-five reflector electrode fingers. As described above, it is preferable that the number of reflector electrode fingers of the reflectors in the first parallel arm resonator is less than the number of reflector electrode fingers of the reflectors in the second parallel arm resonator. This makes it possible to reduce the insertion loss of the filter device 1, and to promote the miniaturization of the filter device 1.

More specifically, the first parallel arm resonator in the first preferred embodiment is such that the resonant frequency is high, the number of pairs of electrode fingers in the IDT electrode is high, and the overlap width is narrow. Therefore, the Qmax frequency approaches the resonant frequency. This resonant frequency is close to the frequency of the end portion on the low-frequency side of the passband of the filter device 1, as described above. When the number of reflector electrode fingers is small, the Q value near the anti-resonant frequency is low, but the change in the Q value near the resonant frequency is small. Accordingly, even if the number of reflector electrode fingers in the first parallel arm resonator is smaller, it is difficult for the Q value to be lowered on the low-frequency side of the passband of the filter device 1. In addition, in the case where the number of reflector electrode fingers is small, the miniaturization of the first parallel arm resonator can be promoted. Thus, the insertion loss of the filter device 1 can be reduced, and the miniaturization of the filter device 1 can be promoted.

As indicated in Table 3, the electrostatic capacitance of the first parallel arm resonator is about 1.26 pF, for example. The electrostatic capacitance of the second parallel arm resonator is about 1.9 pF, for example. The term "electrostatic capacitance" here refers to the electrostatic capacitance of a portion of the parallel arm resonator where the IDT electrode is provided. It is preferable that the electrostatic capacitance of the first parallel arm resonator be smaller than the electrostatic capacitance of the second parallel arm resonator. This makes it possible to more reliably reduce the insertion loss of the filter device 1.

In more detail, the resonant frequency of the first parallel arm resonator is higher than the resonant frequency of the second parallel arm resonator. Therefore, the resonant frequency of the first parallel arm resonator is closer to the frequency of the end portion on the low-frequency side of the passband of the filter device 1 than the resonant frequency of the second parallel arm resonator is. Thus, the first parallel arm resonator has a greater effect on the low-frequency side of the passband than the second parallel arm resonator. The electrostatic capacitance of the first parallel arm resonator is smaller than the electrostatic capacitance of the second parallel arm resonator in the first preferred embodiment. This makes it possible to reduce the effect of the first parallel arm resonator on the insertion loss of the filter device 1. Accordingly, the insertion loss can be more reliably reduced.

The electrostatic capacitance is mainly proportional to the product of the number of pairs of electrode fingers and the overlap width in the IDT electrode. The larger the electrostatic capacitance, the larger the product of the number of pairs of electrode fingers and the overlap width. It is preferable that the product of the number of pairs of electrode fingers and the overlap width in the IDT electrode of the first parallel arm resonator be smaller than the product of the number of pairs of electrode fingers and the overlap width in the IDT electrode of the second parallel arm resonator. In this case, the electrostatic capacitance of the first parallel arm resonator can be made smaller than the electrostatic capacitance of the second parallel arm resonator. Accordingly, the insertion loss of the filter device 1 can be more reliably reduced, as described above.

It is assumed hereinafter that the Qmax frequency of the first parallel arm resonator is f1, and the Qmax frequency of the second parallel arm resonator is f2. As indicated in Table 4, the Qmax frequency f1 is about 774 MHz, and the Qmax frequency f2 is about 778 MHz in the first preferred embodiment. Thus, (|f1−f2|/f1)×100[%] is about 0.5%. As described above, it is preferable that (|f1−f2|/f1)×100[%]≤1 [%]. In this case, it can be said that the Qmax frequency f1 and the Qmax frequency f2 are approximately the same. Accordingly, the Q value at the combined Q max frequency of the first parallel arm resonator and the second parallel arm resonator can be effectively increased. Thus, the insertion loss on the low-frequency side within the passband of the filter device 1 can be effectively reduced.

Figure 8:
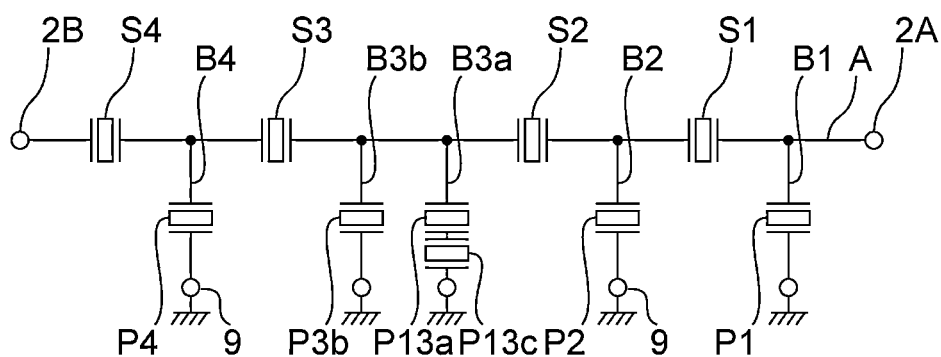
FIG. 8 is a circuit diagram of a filter device according to a modification of the first preferred embodiment of the present invention.

The first parallel arm and the second parallel arm are each provided with one parallel arm resonator in the first preferred embodiment. However, this is not the only possible configuration. For example, in a modification of the first preferred embodiment illustrated in FIG. 8, the first parallel arm is provided with a parallel arm resonator P13a as the first parallel arm resonator and a parallel arm resonator P13c as a third parallel arm resonator. The first parallel arm resonator and the third parallel arm resonator are connected in series with each other. Table 5 indicates the design parameters of the first parallel arm resonator, the second parallel arm resonator, and the third parallel arm resonator in the present modification.

TABLE 5

|  | Resonant frequency | Number of pairs of electrode fingers of IDT electrode | Overlap width | Electrostatic capacitance of IDT electrode | Number of reflector electrode fingers |
| --- | --- | --- | --- | --- | --- |
| Parallel arm resonator P13a (first parallel arm resonator) | 775 MHz | 120 pairs | 40 μm | 2.52 pF | 17 |
| Parallel arm resonator P3b (second parallel arm resonator) | 769 MHz | 40 pairs | 90 μm | 1.9 pF | 25 |
| Parallel arm resonator P13c (third parallel arm resonator) | 775 MHz | 120 pairs | 40 μm | 2.52 pF | 17 |

As indicated in Table 5, the design parameters of the first parallel arm resonator and the third parallel arm resonator are the same. The design parameters of the first parallel arm resonator and the second parallel arm resonator need not necessarily be the same. It is only necessary that the number of pairs of electrode fingers of the IDT electrode in the first parallel arm resonator is greater than the number of pairs of electrode fingers of the IDT electrode in the second parallel arm resonator, and the overlap width of the IDT electrode in the first parallel arm resonator be narrower than the overlap width of the IDT electrode in the second parallel arm resonator.

In the present modification, the combined electrostatic capacitance of the first parallel arm resonator and the third parallel arm resonator is about 1.26 pF, for example. That is, the combined electrostatic capacitance of the first parallel arm resonator and the third parallel arm resonator is the same or substantially the same as the electrostatic capacitance of the first parallel arm resonator in the first preferred embodiment indicated in Table 1. In contrast, the electrostatic capacitance of each of the first parallel arm resonator and the third parallel arm resonator is greater than the first parallel arm resonator in the first preferred embodiment. Thus, in the present modification, even if the electrostatic capacitance of each of the first parallel arm resonator and the third parallel arm resonator is increased, it is difficult for the combined electrostatic capacitance of the first parallel arm resonator and the third parallel arm resonator to become large. Since the electrostatic capacitance of the first parallel arm resonator and the third parallel arm resonator is large, the power consumption can be reduced even when large power is applied to each of the first parallel arm resonator and the third parallel arm resonator. Thus, heat generation can be reduced or prevented and electric power handling capability can be improved in each of the first parallel arm resonator and the third parallel arm resonator.

In contrast, as indicated in Table 5, the electrostatic capacitance of the second parallel arm resonator is about 1.9 pF, for example. As described above, it is preferable that the combined electrostatic capacitance of the first parallel arm resonator and the third parallel arm resonator is smaller than the electrostatic capacitance of the second parallel arm resonator. This makes it possible to reduce the effect of the first parallel arm resonator and the third parallel arm resonator on the insertion loss of the filter device 11. Accordingly, the insertion loss can be more reliably reduced.

The combined electrostatic capacitance of a plurality of resonators is different between the case where the plurality of resonators are connected in series with each other and the case where the plurality of resonators are connected in parallel with each other. For example, if two resonators are connected in series with each other, and the electrostatic capacitance of one resonator is C1, the electrostatic capacitance of the other resonator is C2, and the combined capacitance is C, then the relationship (1/C)=(1/C1)+(1/C2) is satisfied. If the above two resonators are connected in parallel with each other, then the relationship C=C1+C2 is satisfied.

Referring back to FIG. 1, the first parallel arm in the first preferred embodiment is the parallel arm B3a. The second parallel arm is the parallel arm B3b. Of the plurality of parallel arms, parallel arms other than the first parallel arm and the second parallel arm are third parallel arms. Specifically, the parallel arm B1, the parallel arm B2, and the parallel arm B4 are each a third parallel arm. A portion of the series arm A where each third parallel arm branches is separated by a series arm resonator from portions of the series arm A where the first parallel arm and the second parallel arm branch. Thus, the potential of the portion of the series arm A where each third parallel arms branches and the potential of the portions of the series arm A where the first parallel arm and the second parallel arm branch are different from each other.

Parallel arm resonators provided in or on the third parallel arms are fourth parallel arm resonators according to the present invention. Specifically, the parallel arm resonator P1, the parallel arm resonator P2, and the parallel arm resonator P4 are each a fourth parallel arm resonator. In the first preferred embodiment, of the resonant frequencies of all the parallel arm resonators, the resonant frequency of the first parallel arm resonator is the highest, and, of the overlap widths of the IDT electrodes in all the parallel arm resonators, the overlap width of the IDT electrode in the first parallel arm resonator is the narrowest. Accordingly, the insertion loss on the low-frequency side within the passband of the filter device 1 can be more reliably reduced.

In more detail, as described above, in the first preferred embodiment, the resonant frequency of the second parallel arm resonator and each fourth parallel arm resonator is lower than the resonant frequency of the first parallel arm resonator. In this case, the anti-resonant frequency of the second parallel arm resonator and each fourth parallel arm resonator is close to the frequency of the end portion on the low-frequency side of the passband of the filter device 1. Therefore, when the Q value is low at the anti-resonant frequency of the second parallel arm resonator and each fourth parallel arm resonator, the insertion loss on the low-frequency side within the passband becomes large. Here, in the case where the overlap width in the second parallel arm resonator and each fourth parallel arm resonator is narrow, surface acoustic waves easily leak from the overlap region to each busbar side. Thus, the Q value of the second parallel arm resonator and each fourth parallel arm resonator is reduced. In contrast, in the first preferred embodiment, the overlap width of the IDT electrode in the second parallel arm resonator and each fourth parallel arm resonator is wider than the overlap width of the IDT electrode in the first parallel arm resonator. Thus, the Q value at the anti-resonant frequency of the second parallel arm resonator and each fourth parallel arm resonator can be more reliably increased.

Furthermore, the resonant frequency of the first parallel arm resonator is high. Therefore, the anti-resonant frequency of the first parallel arm resonator is away from the frequency of the end portion on the low-frequency side of the passband. Therefore, even if the Q value is low at the anti-resonant frequency of the first parallel arm resonator, it is not likely to affect the insertion loss on the low-frequency side within the passband. Accordingly, the insertion loss on the low-frequency side within the passband of the filter device 1 can be more reliably reduced.

When a wavelength defined by the electrode finger pitch of the IDT electrode is A, then it is preferable that the overlap width of the IDT electrode in the second parallel arm resonator and each fourth parallel arm resonator be about 10λ or greater, for example. Accordingly, the Q value can be more reliably increased at the anti-resonant frequency of the second parallel arm resonator and each fourth parallel arm resonator. It is preferable that the overlap width of the IDT electrode in the first parallel arm resonator be less than about 10λ. In this case, by increasing the number of pairs of electrode fingers of the IDT electrode in the first parallel arm resonator, the Q value can be effectively increased at the resonant frequency. The electrode finger pitch is the center-to-center distance between adjacent electrode fingers that are connected to different potentials.

The relationship between the resonant frequency and the overlap width of the IDT electrode in the first parallel arm resonator and each fourth parallel arm resonator is not limited to the above. Although the filter device 1 includes three third parallel arms and three fourth parallel arm resonators, the filter device 1 is not limited to this configuration. For example, the filter device 1 may include at least one third parallel arm and at least one fourth parallel arm resonator.

The filter device 1 need not necessarily include a series arm resonator. The filter device 1 may include, for example, a longitudinally-coupled resonator acoustic wave filter. In this case, the longitudinally-coupled resonator acoustic wave filter may be arranged in or on the series arm. The longitudinally-coupled resonator acoustic wave filter as an acoustic wave element may then separate a portion of the series arm where each third parallel arm branches from portions of the series arm where the first parallel arm and the second parallel arm branch. Even in this case, the insertion loss on the low-frequency side within the passband of the filter device can be reduced.

The resonant frequencies of SAW resonators can be compared using an electrode finger pitch and a duty ratio. For example, in the case where SAW resonators have the same or substantially the same electrode finger thickness, a SAW resonator with the greater inverse of the product of the electrode finger pitch and the duty ratio has a higher resonant frequency than that of the other SAW resonator.

It is preferable that the inverse of the product of the electrode finger pitch and the duty ratio of the IDT electrode in the first parallel arm resonator be greater than the inverse of the product of the electrode finger pitch and the duty ratio of the IDT electrode in the second parallel arm resonator. This allows the resonant frequency of the first parallel arm resonator to be more reliably higher than the resonant frequency of the second parallel arm resonator.

It is preferable that the electrode finger pitch in each of the first parallel arm resonator and the second parallel arm resonator be wider than the electrode finger pitch in each series arm resonator. This allows the anti-resonant frequency of each of the first parallel arm resonator and the second parallel arm resonator to more reliably become lower than the anti-resonant frequency of each series arm resonator.

A dielectric film may be provided on the piezoelectric substrate 3 of the parallel arm resonator P3a illustrated in FIG. 2 so as to cover the IDT electrode 4. The same is true for each of the other parallel arm resonators and each series arm resonator. Also in this case, as in the first preferred embodiment, the insertion loss on the low-frequency side within the passband of the filter device can be reduced. In addition, it is difficult for the IDT electrode 4 to be damaged.

In the case where SAW resonators having dielectric films are such that the dielectric films have the same or substantially the same thickness and the thickness of electrode fingers is the same or substantially the same, the resonant frequency of a SAW resonator with the greater inverse of the product of the electrode finger pitch and the duty ratio is higher than the resonant frequency of the other SAW resonator.

The filter devices according to preferred embodiments of the present invention can be used in a multiplexer, for example. An example of this will be discussed below.

Figure 9:
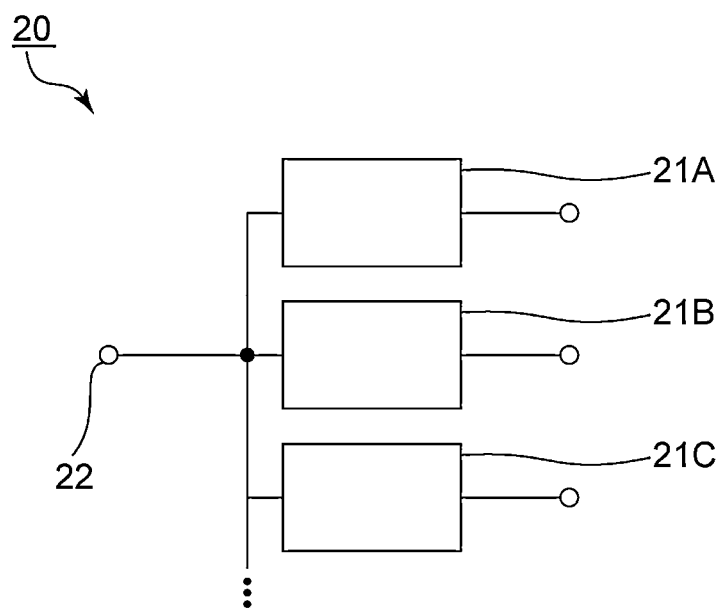
FIG. 9 is a schematic diagram of a multiplexer according to a second preferred embodiment of the present invention.

FIG. 9 is a schematic diagram of a multiplexer according to a second preferred embodiment of the present invention.

A multiplexer 20 includes a common connection terminal 22 and a plurality of filters. The plurality of filters are commonly connected to the common connection terminal 22. In the present preferred embodiment, the common connection terminal 22 is, for example, an antenna terminal. The antenna terminal is connected to an antenna.

The plurality of filters of the multiplexer 20 include a first filter 21A, a second filter 21B, and a third filter 21C, and a plurality of other filters. It is only necessary that the multiplexer 20 includes two or more filters.

The first filter 21A is the filter device of the first preferred embodiment. It is only necessary that the multiplexer 20 includes at least one filter according to a preferred embodiment the present invention. In the present preferred embodiment, the insertion loss on the low-frequency side within the passband of the first filter 21A in the multiplexer 20 can be reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band-pass filter device having a passband, comprising:
    an input terminal and an output terminal;
    at least one ground terminal; and
    a plurality of parallel arm resonators including a first parallel arm resonator and a second parallel arm resonator; wherein
    in a circuit configuration, a path connecting the input terminal and the output terminal is a series arm, and a plurality of paths branching from the series arm to the ground terminal are a plurality of parallel arms;
    the plurality of parallel arms include a first parallel arm and a second parallel arm branching to the ground terminal from portions of the series arm that are at a same or substantially a same potential, the first parallel arm resonator is provided in or on the first parallel arm, and the second parallel arm resonator is provided in or on the second parallel arm;
    the plurality of parallel arm resonators each include an IDT electrode including a plurality of electrode fingers, and, in each IDT electrode, when a direction in which the plurality of electrode fingers extend is an electrode finger extending direction, each IDT electrode includes an overlap region where adjacent electrode fingers overlap each other in a direction perpendicular or substantially perpendicular to the electrode finger extending direction;
    anti-resonant frequencies of the first parallel arm resonator and the second parallel arm resonator are both positioned within the passband;
    a resonant frequency of the first parallel arm resonator is higher than a resonant frequency of the second parallel arm resonator, a number of pairs of the electrode fingers of the IDT electrode in the first parallel arm resonator is greater than a number of pairs of the electrode fingers of the IDT electrode in the second parallel arm resonator, and, when a dimension of the overlap region along the electrode finger extending direction is an overlap width, the overlap width of the IDT electrode in the first parallel arm resonator is narrower than the overlap width of the IDT electrode in the second parallel arm resonator; and
    the resonant frequency of the first parallel arm resonator and the resonant frequency of the second parallel arm resonator are both positioned outside the passband on a low-frequency side of the passband.

2. The filter device according to claim 1, wherein
    the first parallel arm resonator and the second parallel arm resonator each include a pair of reflectors facing each other across the IDT electrode;
    each of the pair of reflectors includes a plurality of reflector electrode fingers; and
    a number of the plurality of reflector electrode fingers of the pair of reflectors in the first parallel arm resonator is less than a number of the plurality of reflector electrode fingers of the pair of reflectors in the second parallel arm resonator.

3. The filter device according to claim 1, wherein, when a frequency at which a Q value of the first parallel arm resonator is highest is f1, and a frequency at which a Q value of the second parallel arm resonator is highest is f2, $(|f1-f2|/f1) \times 100[\%] \leq 1[\%]$.

4. The filter device according to claim 1, wherein an electrostatic capacitance of the first parallel arm resonator is smaller than an electrostatic capacitance of the second parallel arm resonator.

5. The filter device according to claim 1, wherein the plurality of parallel arm resonators include a third parallel arm resonator provided in or on the first parallel arm and connected in series with the first parallel arm resonator.

6. The filter device according to claim 5, wherein a combined electrostatic capacitance of the first parallel arm resonator and the third parallel arm resonator is smaller than an electrostatic capacitance of the second parallel arm resonator.

7. The filter device according to claim 1, further comprising:
    at least one acoustic wave element provided in or on the series arm; wherein
    the plurality of parallel arms include at least one third parallel arm, and a portion of the series arm where the third parallel arm branches is separated by the acoustic wave element from portions of the series arm where the first parallel arm and the second parallel arm branch;
    the plurality of parallel arm resonators include at least one fourth parallel arm resonator provided in or on the third parallel arm; and
    of resonant frequencies of all of the parallel arm resonators, the resonant frequency of the first parallel arm resonator is highest, and, of the overlap widths of the IDT electrodes in all of the parallel arm resonators, the overlap width of the IDT electrode in the first parallel arm resonator is narrowest.

8. The filter device according to claim 1, wherein
    the filter device is a ladder filter;
    at least one acoustic wave element is provided in or on the series arm; and
    the at least one acoustic wave element is a series arm resonator.

9. A multiplexer comprising:
    a common connection terminal; and
    a plurality of filters commonly connected to the common connection terminal; wherein
    at least one of the plurality of filters is a filter device according to claim 1.

10. The multiplexer according to claim 9, wherein
the first parallel arm resonator and the second parallel arm resonator each include a pair of reflectors facing each other across the IDT electrode;
each of the pair of reflectors includes a plurality of reflector electrode fingers; and
a number of the plurality of reflector electrode fingers of the pair of reflectors in the first parallel arm resonator is less than a number of the plurality of reflector electrode fingers of the pair of reflectors in the second parallel arm resonator.

11. The multiplexer according to claim 9, wherein, when a frequency at which a Q value of the first parallel arm resonator is highest is f1, and a frequency at which a Q value of the second parallel arm resonator is highest is f2, $(|f1-f2|/f1) \times 100[\%] \leq 1[\%]$.

12. The multiplexer according to claim 9, wherein an electrostatic capacitance of the first parallel arm resonator is smaller than an electrostatic capacitance of the second parallel arm resonator.

13. The multiplexer according to claim 9, wherein the plurality of parallel arm resonators include a third parallel arm resonator provided in or on the first parallel arm and connected in series with the first parallel arm resonator.

14. The multiplexer according to claim 13, wherein a combined electrostatic capacitance of the first parallel arm resonator and the third parallel arm resonator is smaller than an electrostatic capacitance of the second parallel arm resonator.

15. The multiplexer according to claim 9, further comprising:
at least one acoustic wave element provided in or on the series arm; wherein
the plurality of parallel arms include at least one third parallel arm, and a portion of the series arm where the third parallel arm branches is separated by the acoustic wave element from portions of the series arm where the first parallel arm and the second parallel arm branch;
the plurality of parallel arm resonators include at least one fourth parallel arm resonator provided in or on the third parallel arm; and
of resonant frequencies of all of the parallel arm resonators, the resonant frequency of the first parallel arm resonator is highest, and, of the overlap widths of the IDT electrodes in all of the parallel arm resonators, the overlap width of the IDT electrode in the first parallel arm resonator is narrowest.

16. The multiplexer according to claim 9, wherein
the filter device is a ladder filter;
at least one acoustic wave element is provided in or on the series arm; and
the at least one acoustic wave element is a series arm resonator.

* * * * *